United States Patent
Matsumoto (10) Patent No.: US 8,427,804 B2
(45) Date of Patent: Apr. 23, 2013

(54) POWER AMPLIFIER

(75) Inventor: Yoshitaka Matsumoto, Gunma-ken (JP)

(73) Assignees: Sanyo Semiconductor Co., Ltd. (JP); Semiconductor Components Industries, LLC, Phoenix, AZ (US)

( * ) Notice: Subject to any disclaimer, the term of this patent is extended or adjusted under 35 U.S.C. 154(b) by 920 days.

(21) Appl. No.: 12/186,797

(22) Filed: Aug. 6, 2008

(65) Prior Publication Data
US 2009/0284886 A1 Nov. 19, 2009

(30) Foreign Application Priority Data
Aug. 7, 2007 (JP) ................................. 2007-204892

(51) Int. Cl.
*H02H 3/08* (2006.01)

(52) U.S. Cl.
USPC ........................................................ 361/93.7

(58) Field of Classification Search .................. 361/93.7
See application file for complete search history.

(56) References Cited

U.S. PATENT DOCUMENTS

| | | | | |
|---|---|---|---|---|
| 5,975,057 A | * | 11/1999 | Repplinger et al. | 123/490 |
| 6,650,100 B1 | * | 11/2003 | Kohout et al. | 323/282 |
| 2005/0264970 A1 | | 12/2005 | Shinobu | |
| 2006/0022752 A1 | * | 2/2006 | Akiyama et al. | 330/251 |
| 2006/0256492 A1 | * | 11/2006 | Zhao et al. | 361/93.7 |
| 2007/0079710 A1 | | 4/2007 | Ishizaki | |

FOREIGN PATENT DOCUMENTS

| | | |
|---|---|---|
| JP | 63-268432 A | 11/1988 |
| JP | 2002-158543 | 5/2002 |
| JP | 2004-336860 A | 11/2004 |
| JP | 2005-333636 A | 12/2005 |
| JP | 2005-339355 | 12/2005 |
| JP | 2007-96364 A | 4/2007 |

OTHER PUBLICATIONS

Japanese Office Action for Patent Application No. 2007-204892 mailed Jul. 19, 2011 with English translation.

* cited by examiner

*Primary Examiner* — Rexford Barnie
*Assistant Examiner* — Ann Hoang
(74) *Attorney, Agent, or Firm* — Cantor Colburn LLP (57) ABSTRACT

A power amplifier for driving a load connected to an output terminal having an output transistor connected in parallel with a corresponding current detection path between the output terminal and a power supply. The detection path includes a switching device and a resistor connected in series, the switching device is turned on only during an on-state period of the corresponding output transistor, and the presence or absence of over-current generation is detected at the output transistors on the basis of a sensing signal obtained from a point connecting the switching device and the resistor. When over-current is detected, the operation of the output transistors is stopped to protect the amplifier.

7 Claims, 5 Drawing Sheets

POWER AMPLIFIER

BACKGROUND

1. Technical Field

The present invention relates to a configuration for protection from over-current in a digital amplifier driving a load.

2. Related Art

In a power amplifier driving a load connected to an output terminal, if an incorrect connection (user caused incorrect wiring, short-circuit, and so forth) occurs, such as between the output terminal and a power supply or between power supply terminals, an over-current flows to an output transistor for outputting a driving signal to the load connected to the output terminal so that failure of the output transistor easily occurs. Therefore, an over-current protective measure has been provided in the related art to protect the output transistor by detecting over-current flowing to the output transistor.

Figure 1:
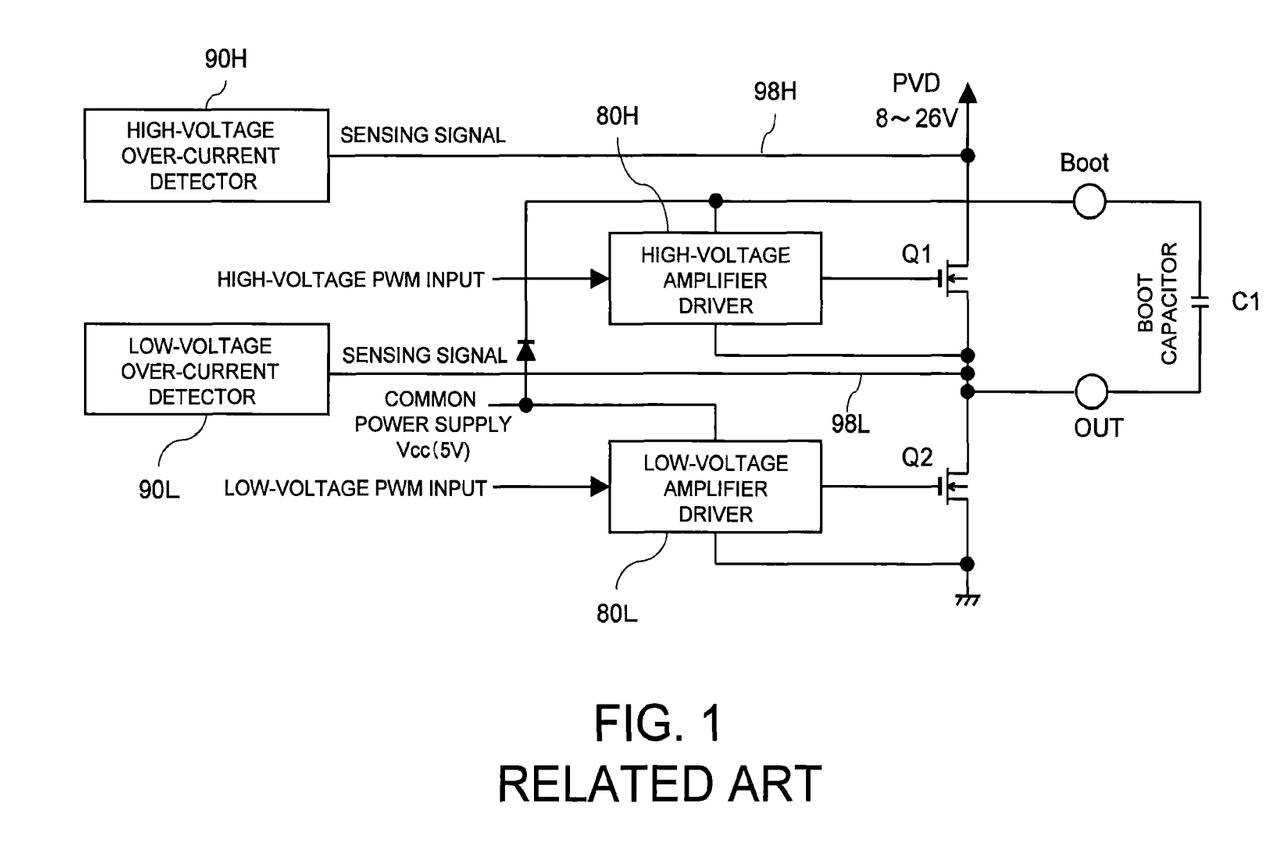
FIG. 1 shows a configuration for over-current detection in a digital power amplifier of the related art.

FIG. 1 shows a block diagram of an output section of a digital amplifier provided with an over-current protective measure of the related art. The digital amplifier has an amplifier output section at an output terminal OUT to which a load L is connected. The amplifier output section has a high-voltage (source) output transistor Q1 provided between a high-voltage power supply PVD and the output terminal OUT and a low-voltage (sink) output transistor Q2 provided between a low-voltage power supply (ground GND) and the output terminal OUT.

To a gate of the high-voltage output transistor Q1 is connected a high-voltage amplifier driver 80H and to a gate of the low-voltage output transistor Q2 is connected a low-voltage amplifier driver 80L.

In accordance with pulse signals corresponding to PWM (Pulse Width Modulation) signals supplied from a PWM signal generator that is not shown, the amplifier drivers 80H and 80L drive the corresponding high-voltage output transistor Q1 and the low-voltage output transistor Q2 on and off. The high-voltage output transistor Q1 and the low-voltage output transistor Q2 do not turn on simultaneously. When the high-voltage output transistor Q1 turns off and the low-voltage output transistor Q2 turns on, a load driving signal at GND level (0 V) is output from the output terminal OUT. On the other hand, when the low-voltage output transistor Q2 turns off and the high-voltage output transistor Q1 turns on, a voltage corresponding to the high-voltage power supply PVD (8 V to 26 V) is applied to the output terminal OUT via the high-voltage output transistor Q1.

The digital amplifier of FIG. 1 employs N-channel FETs for both the above-mentioned output transistors Q1 and Q2. Furthermore, a bootstrap method is employed, and a common power supply Vcc of 5 V, for example, is employed as the high-voltage power supply for both the above-mentioned amplifier drivers 80H and 80L for driving the output transistors Q1 and Q2 so that the amplifier drivers 80H and 80L operate under equal voltage conditions and driving signals having equal voltages are also supplied to the output transistors Q1 and Q2 so as to control these transistors. A boot capacitor C1 is connected between the output terminal OUT and a boot terminal Boot. The boot capacitor C1 is charged by the above-mentioned common power supply, which is connected to the boot terminal Boot. When the high-voltage output transistor Q1 turns on, the output voltage at the output terminal OUT rises in accordance with the holding voltage of the boot capacitor C1, and in the on-state period of the above-mentioned high-voltage output transistor Q1, the "high-voltage power supply PVD (26 V)+holding voltage (≠5 V) of capacitor C1", namely, a load driving signal of 31 V in this example is output from the output terminal OUT.

In the digital amplifier of the bootstrap method described above, a high-voltage detection line 98H is connected to the high-voltage power supply PVD for the high-voltage output transistor Q1 and a sensing signal obtained from the high-voltage detection line 98H is supplied to a high-voltage over-current detector 90H. Furthermore, a low-voltage detection line 98L is connected to the output terminal OUT of the low-voltage output transistor Q2 and a sensing signal obtained from the low-voltage detection line 98L is supplied to a low-voltage over-current detector 90L.

The power supply PVD voltage for the output transistor Q1 is always supplied to the high-voltage over-current detector 90H and the output terminal OUT voltage for the output transistor Q2 is always supplied to the low-voltage over-current detector 90L.

For example, when the output terminal OUT is shorted to GND, an over-current flows to the high-voltage output transistor Q1 so that the existence of an on-state resistance of the output transistor Q1 causes the voltage of the sensing signal obtained via the high-voltage detection line 98H to rise above the normal value. When the high-voltage power supply PVD is shorted to the output terminal OUT, an over-current flows to the low-voltage output transistor Q2 so that the existence of an on-state resistance of the output transistor Q2 causes the voltage of the sensing signal obtained via the low-voltage detection line 98L to rise above the normal value. Even when the PVD is shorted to GND, the residual voltages of the output transistors Q1 and Q2 rise in the same manner above the normal voltages.

Therefore, when an over-current is generated at the output transistors Q1 and Q2 due to a short-circuit or other cause, the high-voltage over-current detector 90H and the low-voltage over-current detector 90L can detect the generation of over-current on the basis of the corresponding sensing signal.

When the generation of an over-current is detected in the over-current detectors 90H and 90L described above, the over-current detectors 90H and 90L generate an over-current detecting signal, and in accordance with this over-current detecting signal, the high-voltage and low-voltage amplifiers 80H and 80L stop operating and the output transistors Q1 and Q2 stop operating. Therefore, the power amplifier can be protected from over-current.

However, to the high-voltage detection line 98H and the low-voltage detection line 98L is always input a sensing signal having large amplitude (between the power supply voltage and the output terminal voltage) in accordance with the amplitude of the load driving signal from the output terminal OUT. The sensing interval is the voltage between PVD and OUT for the high-voltage over-current detector 90H and the voltage between OUT and GND for the low-voltage over-current detector 90L. Thus, with regard to the high-voltage detection line 98H, the supplied sensing signal is the voltage between the power supply PVD and OUT and the reference voltage of the high-voltage detection line 98H is OUT. Now, if there is a low resistance short to GND when the output transistor Q1 is on, a current higher than normal flows so that a voltage drop corresponding to the on-state resistance of the output transistor Q1 is generated and the output voltage drops. As a result, the voltage across PVD and OUT increases and over-current is detected.

Therefore, in each of the sensing signal input section of the high-voltage over-current detector 90H and the low-voltage over-current detector 90L, it is necessary to use a circuit device capable of sufficiently withstanding sensing signals having large amplitudes. Furthermore, since sensing signals having large amplitudes are supplied to the high-voltage detection line 98H and the low-voltage detection line 98L, which are wired within the power amplifier, noise caused by sensing signals having large amplitudes is superimposed onto the peripheral circuitry, such as the amplifier drivers 80H and 80L, and PWM modulators (not shown), and there is the possibility of malfunction or noise generation.

SUMMARY

Using a simple configuration, the present invention performs detection of over-current in a power amplifier without adversely affecting peripheral circuitry.

The present invention is a power amplifier for driving a load connected to an output terminal, including an output transistor connected between the output terminal and a power supply, the output transistor supplying a driving signal to the load, an amplifier driver for driving the output transistor, a current detection path having a switching device and a resistor connected in series and the path provided in parallel with the output transistor between the power supply and the output terminal, and an over-current detector for controlling the switching device so as to turn on during an on-state operating period of the output transistor and detecting over-current flowing to the output transistor on the basis of a sensing signal obtained from a point connecting the switching device and the resistor of the current detection path.

According to another aspect of the present invention, in the above-mentioned power amplifier, the output transistor includes a high-voltage output transistor provided between a high-voltage power supply and the output terminal and a low-voltage output transistor provided between a low-voltage power supply and the output terminal, a high-voltage current detection path is disposed between the high-voltage power supply and the output terminal and a low-voltage current detection path is disposed between the output terminal and the low-voltage power supply, the high-voltage current detection path and the low-voltage current detection path respectively include the switching device and the resistor, and on the basis of a sensing signal obtained by controlling the switching devices of the high-voltage current detection path and the low-voltage current detection path to turn on, generation of the over-current in a corresponding output transistor is detected.

According to another aspect of the present invention, in the above-mentioned power amplifier, the amplifier driver includes a high-voltage amplifier driver for driving the high-voltage output transistor and a low-voltage amplifier driver for driving the low-voltage output transistor, a common power supply as a high-voltage amplifier driver power supply is connected to the high-voltage amplifier driver and the low-voltage amplifier driver, a boot capacitor can be connected between the output terminal and a boot terminal to which a predetermined power supply is connected, and a driving signal output from the output terminal via the high-voltage output transistor is stepped up in voltage in accordance with a holding voltage of the boot capacitor charged via the boot terminal.

According to another aspect of the present invention, the above-mentioned power amplifier further includes a switch controller for controlling the switching device of the current detection path, the switch controller sets the switching device into a conduction state at a timing of a predetermined delay period from start of on-state operation of the output transistor arranged in parallel with the current detection path, and the over-current detector judges whether or not over-current flows on the basis of a sensing signal obtained during a conduction state of the switching device from a point connecting the switching device and the resistor.

According to another aspect of the present invention, in the above-mentioned power amplifier, the amplifier driver drives the output transistor on and off with a pulse-shaped driving signal in accordance with a pulse width modulated signal.

The present invention provides a current detection path in parallel with an output transistor of the power amplifier, a switching device in the current detection path is set to a conduction state only during an on-state operation period of the output transistor, and over-current generation is detected at the corresponding output transistor during this period. During the conduction state of the switching device, since the sensing signal obtained from a point connecting the switching device and the resistor is a voltage divided value of the switching device and the resistor, the amplitude of the sensing signal can be reduced. Thus, the input withstand voltage of the over-current detector can be reduced, and furthermore, noise superimposition to the peripheral circuitry can be prevented.

Furthermore, if the sensing signal is obtained at a timing at a predetermined time delay from on-state operation of the output transistor and judgment of over-current generation is executed on the basis of this sensing signal, an incorrect detection of over-current can be prevented during a period where overshoot or undershoot occurs in the load driving signal from the output terminal.

DETAILED DESCRIPTION

Hereinafter, preferred embodiments of the present invention will be described with reference to the attached drawings.

The power amplifier relating to the embodiment has audio applications for driving a load, such as a speaker connected to an output terminal, from signals from the output terminal. An output transistor (power transistor) for outputting driving signals to drive the load is provided between the power supply and the output terminal. Furthermore, a current detection path is provided in parallel with the output transistor. A switching device and a resistor are connected in series in the current detection path and a sensing signal is supplied to an over-current detector from a point connecting the switching device and the resistor.

The switching device is controlled so as to selectively enter a conduction state during an on-state operating period of the corresponding output transistor. The resistor has a resistance value sufficiently larger than an on-state resistance value of the switching device so that when the switching device is in a conduction state, the voltage at the connecting point with the switching device is a sufficiently high value. In this manner, when the switching device is in a conduction state, the voltage difference between the power supply and the output terminal is maintained and the amplitude of the sensing signal can be reduced. Furthermore, the resistor functions as a pull-down resistor while the switching device is in a non-conduction state, and sets the voltage of the output wiring of the sensing signal.

Figure 2:
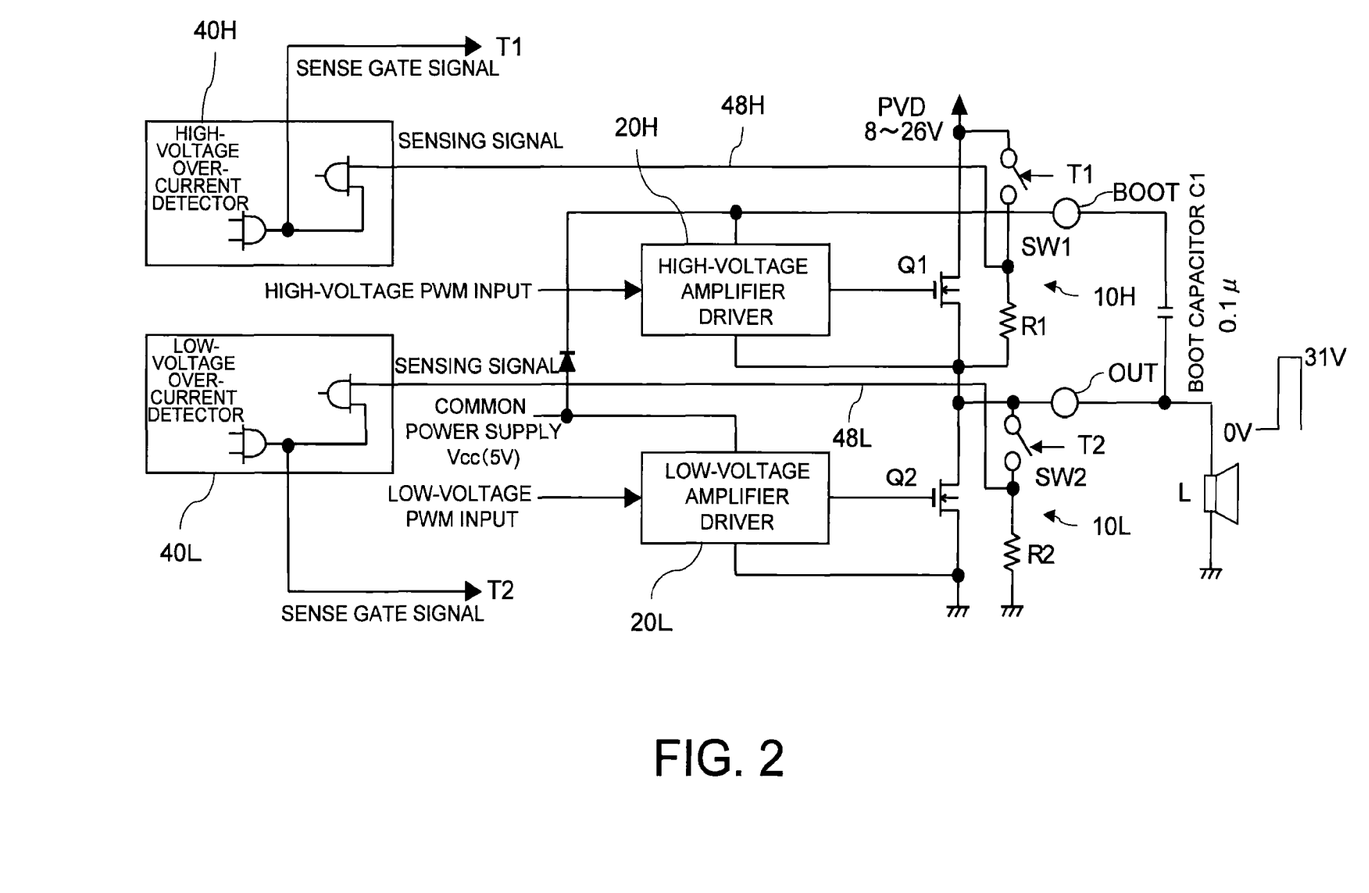
FIG. 2 shows a configuration for over-current detection in a power amplifier relating to an embodiment of the present invention.

FIG. 2 shows a configuration for over-current detection in a power amplifier relating to an embodiment of the present invention. In the example of FIG. 2, a load L is connected between the output terminal OUT and GND, and the high-voltage output transistor Q1 and a high-voltage current detection path 10H are connected in parallel between the output terminal OUT and the high-voltage power supply PVD. The high-voltage current detection path 10H has a switching device SW1 and a resistor R1 connected in series, with the switching device SW1 arranged on the high-voltage power supply side and the resistor R1 arranged on the output terminal side. The point connecting the switching device SW1 and the resistor R1 is connected to a high-voltage over-current detector 40H via a sensing signal output line 48H.

The low-voltage output transistor Q2 and a low-voltage current detection path 10L are connected in serial between the low-voltage power supply GND and output terminal OUT. The path 10L is also provided with a switching device SW2 and a resistor R2 connected in series, with the switching device SW2 arranged on the output terminal side and the resistor R2 arranged on the ground GND side. Furthermore, the point connecting the switching device SW2 and the resistor R2 is connected to a low-voltage over-current detector 40L via a sensing signal output line 48L.

A gate of the high-voltage output transistor Q1 is connected to a high-voltage amplifier driver 20H and a gate of the low-voltage output transistor Q2 is connected to a low-voltage amplifier driver 20L. The high-voltage amplifier driver 20H and the low-voltage amplifier driver 20L supply a driving signal of a desired amplitude at a desired timing to the gates of the above-mentioned output transistors Q1 and Q2 in accordance with a high-voltage PWM signal and a low-voltage PWM signal respectively supplied from PWM signal generators (modulators), which are not shown. Since the output transistor Q1 and the output transistor Q2 do not turn on simultaneously and are controlled to turn on alternately, at the output terminal OUT is obtained a voltage corresponding to the high-voltage power supply PVD when the output transistor Q1 is on and a voltage (0 V) corresponding to GND when the output transistor Q2 is on.

Similar to the amplifier of FIG. 1, the amplifier of FIG. 2 employs N-channel FETs for both the output transistors Q1 and Q2 and employs the bootstrap method so as to operate the amplifier drivers 20H and 20L using the common power supply Vcc as the high-voltage power supply for the amplifier and to respectively control the N-channel transistors Q1 and Q2. Furthermore, the boot capacitor C1 provided between the boot terminal Boot and the output terminal OUT is charged by the above-mentioned power supply Vcc connected via a diode D1 to the boot terminal Boot and the boot capacitor C1 raises the voltage obtained at the output terminal OUT during operation of the high-voltage output transistor Q1. Thus, with Vcc at 5 V and PVD at 26 V, the voltage of the load driving signal supplied to the load L from the output terminal OUT is approximately 31 V when the high-voltage output transistor Q1 is on.

In the embodiment, transistors, more specifically N-channel FETs, are employed as the switching devices SW1 and SW2 provided in the current detection paths 10H and 10L.

Furthermore, to a gate of the switching device SW1 is output a sense gate signal T1 from the high-voltage over-current detector 40H and to a gate of the switching device SW2 is output a sense gate signal T2 from the low-voltage over-current detector 40L. The switching devices SW1 and SW2 turn on when the corresponding H level sense gate signals T1 and T2 are respectively supplied. The sense gate signals T1 and T2 are respectively created in switching control sections and the switching control sections output the above-mentioned sense gate signals T1 and T2 after a predetermined period has elapsed after the corresponding output transistors Q1 and Q2 turn on. Therefore, when the output transistors Q1 and Q2 switch on and off and overshoot and undershoot are likely to be generated in the load driving signal, the switching devices SW1 and SW2 are controlled so as to turn off so that the generation of over-current is not incorrectly detected during this period.

When the switching devices SW1 and SW2 are in a conduction state (on operation), the sensing signals obtained via the sensing signal output lines 48H and 48L are supplied to the corresponding over-current detectors 40H and 40L. The over-current detectors 40H and 40L generate over-current detecting signals as over-current generation when the voltage value of the sensing signals exceeds a reference value and stop the operation of the amplifier drivers and the output transistors Q1 and Q2. Performing control operations in this manner in response to the generation of over-current prevents the occurrence of malfunction caused by the continuous flow of over-current to the amplifier.

Figure 3:
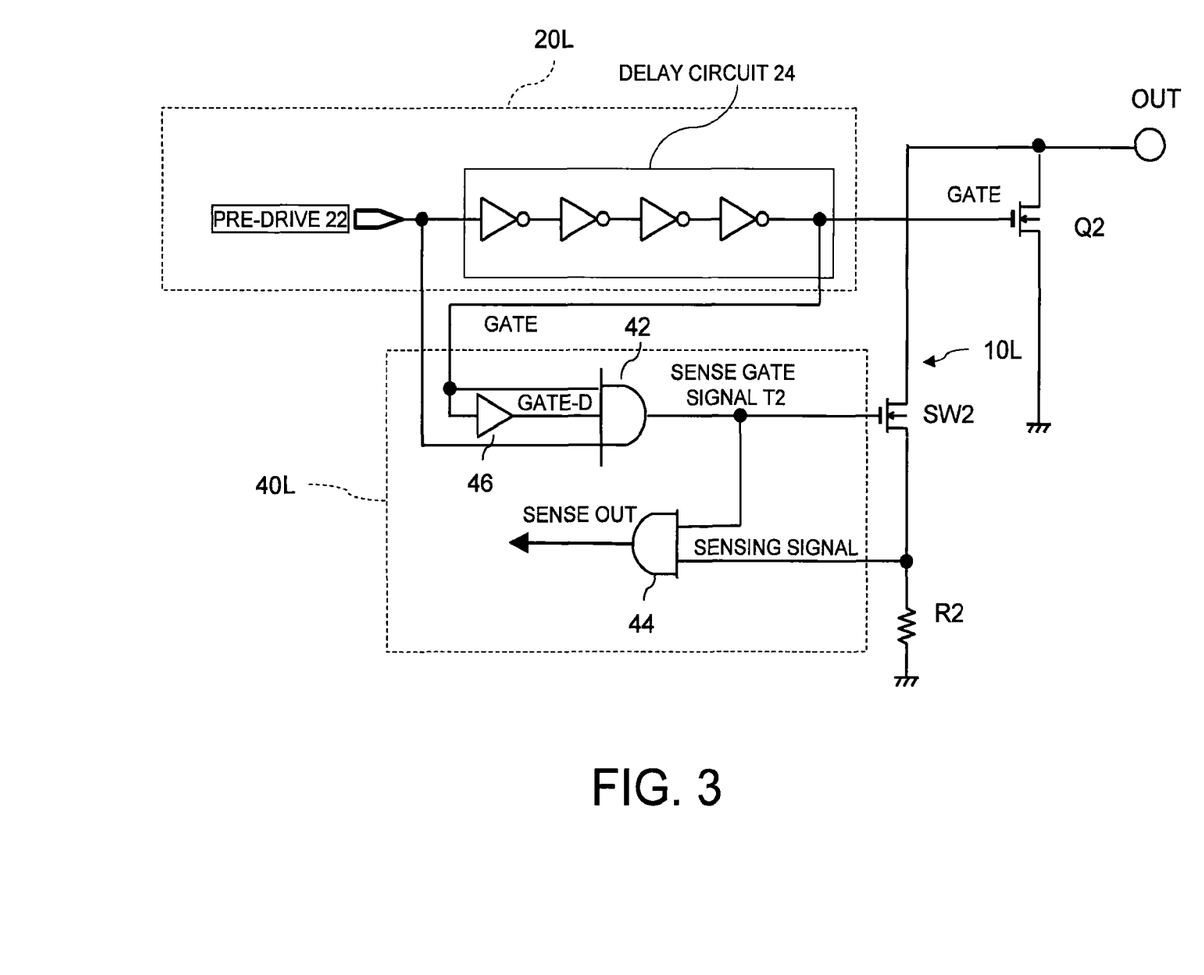
FIG. 3 more specifically illustrates the over-current detector shown in FIG. 2.
Figure 4:
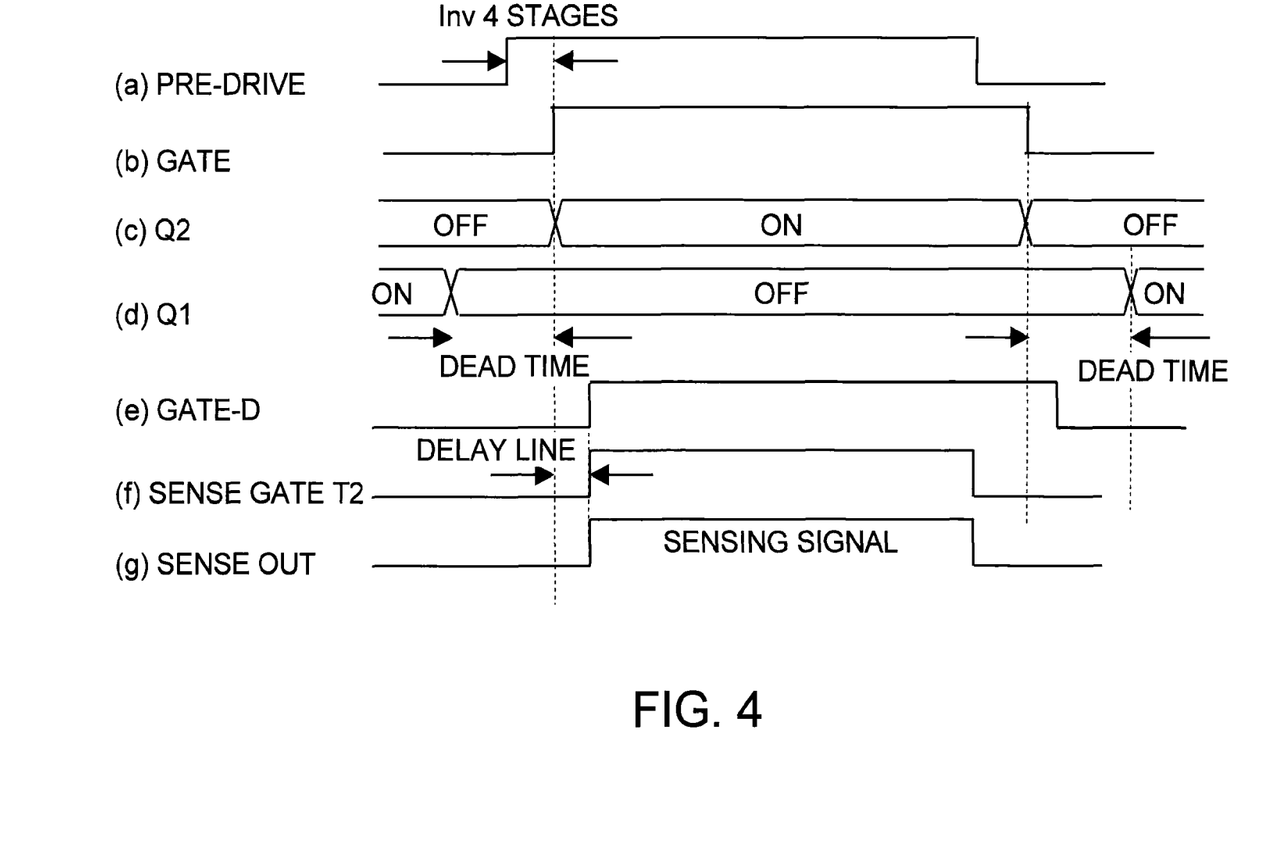
FIG. 4 is a timing chart illustrating an operation of the over-current detector shown in FIG. 3.

Hereinafter, a more specific configuration and operation of the current detection paths 10H and 10L and the over-current detectors 40H and 40L will be described with reference to FIG. 3 and FIG. 4. It should be noted that both FIG. 3 and FIG. 4 illustrate low-voltage examples. FIG. 3 shows part of the circuit configuration of the low-voltage current detection path 10L, over-current detector 40L, and amplifier driver 20L. FIG. 4 shows the operation timing at the various points shown in FIG. 3.

A switch controller for controlling the operation timing of the switching device SW2 is configured from a three-input AND gate 42. The AND gate 42 outputs an operating signal (sense gate signal) T2 to the gate of the switching device SW2 on the basis of an output signal from the low-voltage amplifier driver 20L. A first input of the AND gate 42 is a pre-drive output from a pre-drive 22 of the amplifier driver 20L shown in FIG. 4(a). A second input shown in FIG. 4(b) is a gate signal (Gate) from a delay circuit (in this case a four-stage inverter) 24 for delaying the output from the above-mentioned pre-drive 22 by a predetermined period. A third input shown in FIG. 4(e) is a gate delay signal (Gate-D) obtained by further delaying the gate signal with a delay circuit 46.

When all three inputs of the AND gate 42 reach an H level, the sense gate signal T2 is output at an H level to operate the switching device SW2 and supplied to the gate of the switching device SW2. Namely, after the gate signal reaches an H level and turns on the output transistor Q2, the sense gate signal T2, which is delayed only by a delay period by the delay circuit 46 then reaches an H level, is output from the AND gate 42, and the switching device SW2 is supplied with the sense gate signal T2 and turns on. Therefore, immediately after the output transistor Q2 turns on, undershoot is likely to occur in the load driving signal from the output terminal OUT. However, according to the embodiment, the switching device SW2 can be operated during a period where the level of the load driving signal is stable.

Although not shown, the high-voltage and low-voltage pre-drive outputs have the timing controlled in advance so that the H level periods for turning on the output transistors Q1 and Q2 do not overlap. In the embodiment, the above-mentioned delay circuit 24 further is provided at the output of the pre-drive 22 to more reliably prevent the generation of shoot-through current between the output transistors Q1 and Q2.

In the embodiment, a sensing gate 44 configured from an AND gate is provided at the input section of the over-current detector 40L as shown in FIG. 3. A first input of the sensing gate 44 is the sensing signal supplied from the sensing signal output line 48L, and a second input is the sense gate signal T2 output to the switching device SW2 from the AND gate 42. By employing the sensing gate 44 in the embodiment in this manner, as shown in FIG. 4(g), the sensing signal is obtained from the current detection path 10L for detecting over-current only in the period where the sense gate signal T2 is supplied to the switching device SW2 and the switching device SW2 is on.

The sensing signal output from the sensing gate 44 is supplied to an over-current judgment section within the over-current detector 40L. The judgment section (not shown), for example, compares a predetermined threshold corresponding to over-current capacity of the output transistors with the above-mentioned sensing signal and generates an over-current detecting signal when the threshold is exceeded.

For example, if the high-voltage power supply PVD is shorted with the output terminal OUT to generate an over-current to the output transistor Q2, the amount of current flowing to the resistor R2 via the switching device SW2, which turned on, increases and the voltage at the point connecting the switching device SW2 and the resistor R2 rises. Therefore, the voltage of the sensing signal obtained from this connecting point also rises compared to the normal state and the comparison with the predetermined threshold enables the generation of over-current at the output transistor Q2 to be detected.

By employing a resistance value for the resistor R2 sufficiently higher than the on-state resistance of the switching device SW2 as described hereinabove, the voltage at the connection between the resistor R2 and the switching device SW2 can be set to approximately 2 V or lower even in a state where the switching device SW2 is on and over-current is detected. It should be noted that when the switching device SW2 is not operating, the point connecting the resistor R2 and the switching device SW2 has the same voltage as GND to which the other end of the resistor R2 is connected. Therefore, the amplitude of the sensing signal output to the low-voltage over-current detector 40L has a range of 0V to approximately 2 V, noise superimposition onto the peripheral circuitry can be suppressed, and it is not necessary to particularly raise the input withstand voltage at the input section, such as to the sensing gate 44.

Also the switching device SW1 provided in the high-voltage current detection path 10H can be selectively operated by outputting the sense gate signal T1 after a predetermined period has elapsed after the output transistor Q1 turns on by circuits similar to the delay circuits 24 and 46 and the switch controller (AND gate) 42 of the low-voltage side shown in FIG. 3.

Furthermore, the sensing signal is obtained at the point connecting the resistor R1 and the switching device SW1 via the sensing signal output line 48H only when the sense gate signal T1 is generated by the sensing gate 44. This suppresses incorrect detection.

Moreover, by providing the resistor R1 of the high-voltage current detection path 10H with a resistance value sufficiently higher than the on-state resistance of the switching device SW1, the voltage at the switching device SW1 side of the resistor R1 has a range approximately 2 V lower with respect to the power supply PVD even when over-current flows to the output transistor Q1.

It should be noted that when the switching device SW1 is in a non-conduction state (off), the voltage at the switching device SW1 side of the resistor R1 is fixed at the voltage of the output terminal OUT to which the other end of the resistor R1 is connected. When sensing is performed in accordance with the sense gate signal T1, the output transistor Q1 is in a stable on-state interval and the voltage is the result of a voltage drop of the on-state resistance of the output transistor Q1 from the power supply PVD. Therefore, the amplitude of the sensing signal output to the high-voltage over-current detector 40H has approximately a 2 V range from the PVD voltage (voltage difference is 0 V to 2 V), noise superimposition onto the peripheral circuitry can be suppressed, and it is not necessary to particularly raise the input withstand voltage at the input section, such as to the sensing gate 44.

In the embodiment described hereinabove, the current detection path, which includes the switching device and the resistor, is provided in parallel with the corresponding output transistor. The switching device is switched to a conduction state only in the period where the corresponding output transistor is on to yield the sensing signal. Therefore, the high-voltage and low-voltage sensing signals can be both reduced to small amplitudes. Furthermore, in the over-current detectors 40H and 40L, only when the switching devices SW1 and SW2 are turned on by the two gates 42 and 44, double gating is executed where the sensing signals are obtained from the points connecting with the corresponding resistors R1 and R2 so that incorrect detection of over-current is reliably prevented.

Figure 5:
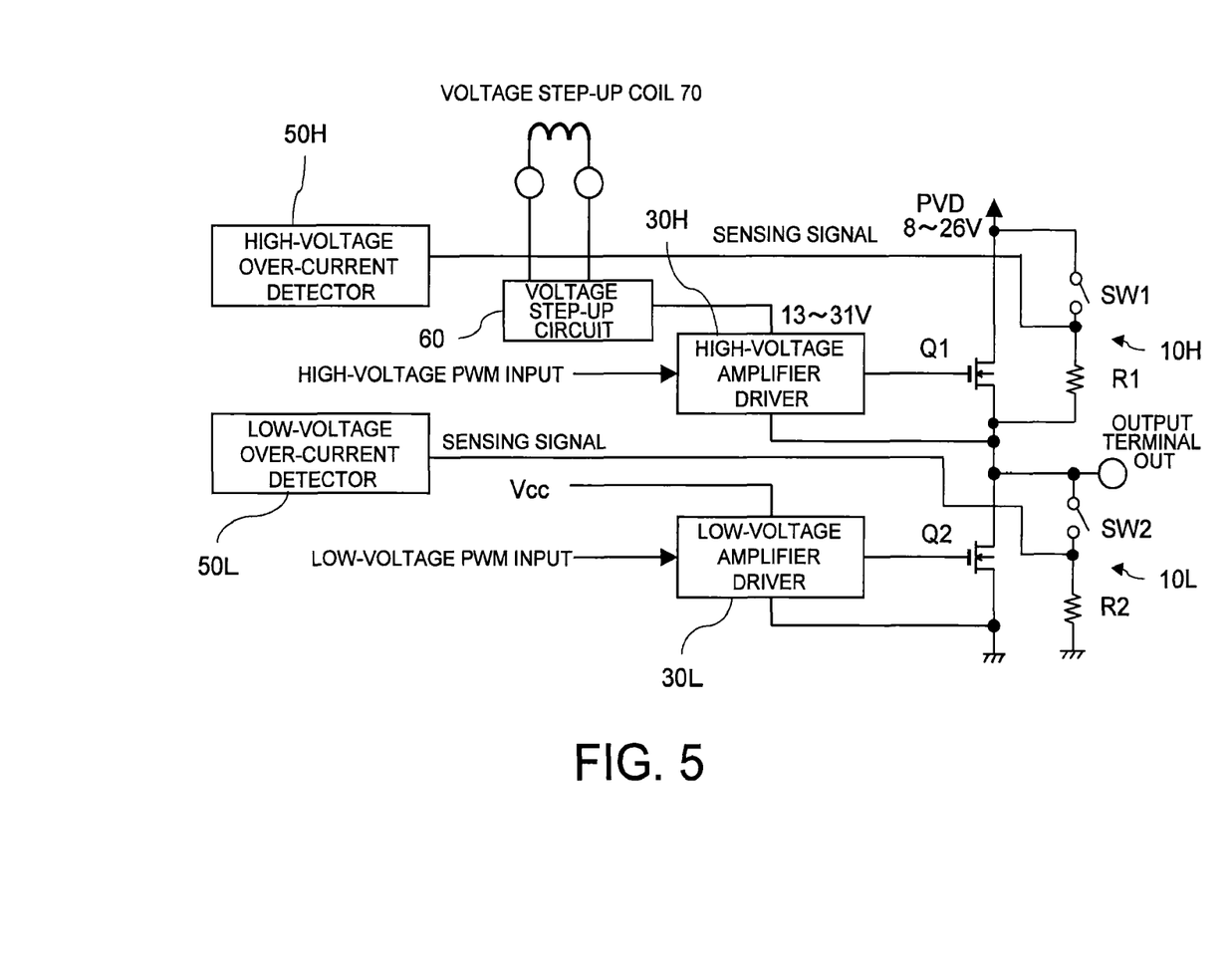
FIG. 5 shows an example of a power amplifier having a configuration relating to an embodiment of the present invention different from that of FIG. 2.

Configurations for over-current detection relating to the embodiment are not limited to digital amplifiers using the bootstrap method described above and a similar effect can be obtained also by employing an amplifier using a voltage step-up circuit, which uses a coil L and a capacitor C. In the example of FIG. 5, the same N-channel FETs are employed for the high-voltage output transistor Q1 and the low-voltage output transistor Q2 as in FIG. 2 and a low-voltage amplifier driver 30L employs Vcc as the operating power supply to create a driving signal for the output transistor Q2.

However, the operating power supply for a high-voltage amplifier driver 30H uses a step-up power supply (for example, approximately 13 V to 31 V) obtained from a step-up circuit 80 using a step-up coil 70, and a pulse signal for driving the high-voltage output transistor Q1 is created by using the step-up power supply. It should be noted that the configurations of the current detection paths 10H and 10L are identical to those in FIG. 2 and over-current detectors 50H and 50L are also identical to over-current detectors 40H and 40L in FIG. 2 with respect to the configurations and control operations of the switch controller gate 42 and gate 44.

In this manner, the high-voltage amplifier driver 30H and the low-voltage amplifier driver 30L use different operating power supplies so that the power amplification efficiency is low compared to the amplifier using the bootstrap method and it is necessary to match the characteristics of the output transistors and the amplifier section in accordance with the operating voltage to be used. However, like the amplifier using the above-mentioned bootstrap method, the reduction in amplitude of the sensing signals and the prevention of incorrect detection of over-current are possible.

What is claimed is:
1. A power amplifier for driving a load connected to an output terminal, comprising:

an output transistor connected between said output terminal and a power supply, said output transistor supplying a driving signal to said load;

an amplifier driver for driving said output transistor;

a current detection path comprising a switching device and a resistor connected in series and said path disposed in parallel with said output transistor between said power supply and said output terminal; and an over-current detector for controlling said switching device so as to turn on during an on-state operating period of said output transistor and detecting over-current flowing to said output transistor on the basis of a sensing signal obtained from a point connecting said switching device and said resistor of said current detection path;

wherein the sensing signal and a signal for turning on or off the switching device are input to a first AND gate;

the over-current detector is configured to control said output transistor on the basis of the output signal of the AND gate;

wherein the power amplifier further comprises a second AND gate configured to output the signal for turning on or off the switching device to the first AND gate; and wherein inputs to the second AND gate comprise:
 a first signal provided from a pre-drive;
 a gate signal obtained by delaying the first signal with a first delay circuit; and
 a delayed gate signal obtained by delaying the gate signal by a second delay circuit.

2. A power amplifier according to claim 1, further comprising a switch controller for controlling said switching device of said current detection path;

said switch controller sets said switching device into a conduction state after a predetermined delay period from start of on-state operation of said output transistor disposed in parallel with said current detection path; and said over-current detector judges whether or not over-current flows on the basis of a sensing signal obtained during a conduction state of said switching device from a point connecting said switching device and said resistor.

3. A power amplifier according to claim 1, wherein: said amplifier driver drives said output transistor on and off with a pulse-shaped driving signal in accordance with a pulse width modulated signal.

4. A power amplifier according to claim 1, wherein:
said output transistor comprises a high-voltage output transistor disposed between a high-voltage power supply and said output terminal and a low-voltage output transistor disposed between a low-voltage power supply and said output terminal;

a high-voltage current detection path is disposed between said high-voltage power supply and said output terminal and a low-voltage current detection path is disposed between said output terminal and said low-voltage power supply, said high-voltage current detection path and said low-voltage current detection path respectively comprise said switching device and said resistor; and on the basis of a sensing signal obtained by controlling the switching devices of said high-voltage current detection path and said low-voltage current detection path to turn on, generation of said over-current in a corresponding output transistor is detected.

5. A power amplifier according to claim 4, wherein:
said amplifier driver comprises a high-voltage amplifier driver for driving said high-voltage output transistor and a low-voltage amplifier driver for driving said low-voltage output transistor;

a common power supply as a high-voltage amplifier driver power supply is connected to said high-voltage amplifier driver and said low-voltage amplifier driver;

a boot capacitor can be connected between said output terminal and a boot terminal to which a predetermined power supply is connected; and a driving signal output from said output terminal via said high-voltage output transistor is stepped up in voltage in accordance with a holding voltage of said boot capacitor charged via said boot terminal.

6. A power amplifier according to claim 4 further comprising a switch controller for controlling said switching device of said current detection path;

said switch controller sets said switching device into a conduction state at a timing of a predetermined delay period from start of on-state operation of said output transistor disposed in parallel with said current detection path; and said over-current detector judges whether or not over-current flows on the basis of a sensing signal obtained during a conduction state of said switching device from a point connecting said switching device and said resistor.

7. A power amplifier according to claim 4, wherein: said amplifier driver drives said output transistor on and off with a pulse-shaped driving signal in accordance with a pulse width modulated signal.

* * * * *